(12) United States Patent
Jeon et al.

(10) Patent No.: US 8,953,394 B2
(45) Date of Patent: Feb. 10, 2015

(54) SEMICONDUCTOR DEVICE CAPABLE OF OPERATING IN BOTH A WIDE INPUT/OUTPUT MODE AND A HIGH-BANDWIDTH MODE

(71) Applicant: SK Hynix Inc., Icheon-si Gyeonggi-do (KR)

(72) Inventors: Seon Kwang Jeon, Icheon-si (KR); Sung Soo Ryu, Seongnam-si (KR); Chang Il Kim, Busan (KR); Jang Ryul Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/071,230

(22) Filed: Nov. 4, 2013

(65) Prior Publication Data
US 2014/0328104 A1 Nov. 6, 2014

(30) Foreign Application Priority Data
May 6, 2013 (KR) ........................ 10-2013-0050381

(51) Int. Cl.
*G11C 7/10* (2006.01)
*G11C 5/02* (2006.01)
(52) U.S. Cl.
CPC ...................................... *G11C 5/025* (2013.01)
USPC ............ 365/189.14; 365/189.15; 365/189.16; 365/189.18; 365/189.05; 365/51; 365/63; 365/225.7

(58) Field of Classification Search
USPC .............. 365/51, 63, 189.14, 189.15, 189.16, 365/189.17, 189.18, 189.05, 225.7
See application file for complete search history.

(56) References Cited

U.S. PATENT DOCUMENTS 5,963,467 A * 10/1999 Miyatake et al. .............. 365/149
7,545,616 B2 * 6/2009 Kim ................................ 361/56
7,974,140 B2 * 7/2011 Ogasawara .............. 365/189.09

FOREIGN PATENT DOCUMENTS

KR 1020110027833 A 3/2011

* cited by examiner

*Primary Examiner* — Andrew Q Tran
(74) *Attorney, Agent, or Firm* — William Park & Associates Patent Ltd.

(57) ABSTRACT

A logic chip and memory chip stacked over the logic chip, the logic chip having a first surface facing the memory chip and a second surface opposite to the first surface and including: first and second internal input/output circuit units for exchanging signals; first external input/output circuit unit for exchanging signals through first external input/output pads formed according to an external interface standard of a first memory over the second surface; and second external input/output circuit unit for exchanging signals through second external input/output pads formed according to an external interface standard of a second memory over the second surface, wherein semiconductor device operates in one of a first mode in which the first internal input/output circuit unit and the first external input/output circuit unit are enabled and a second mode in which the first and second internal input/output circuit units and the second external input/output circuit unit are enabled.

16 Claims, 9 Drawing Sheets

SEMICONDUCTOR DEVICE CAPABLE OF OPERATING IN BOTH A WIDE INPUT/OUTPUT MODE AND A HIGH-BANDWIDTH MODE

CROSS-REFERENCES TO RELATED APPLICATIONS

The present application claims priority to Korean patent application number 10-2013-0050381 filed on May 6, 2013, in the Korean Intellectual Property Office, which is incorporated herein by reference in its entirety.

BACKGROUND

1. Technical Field

The disclosure generally relates to a semiconductor technology, and more particularly, to a semiconductor device.

2. Related Art

With the rapid growth of a mobile market due to the explosion in needs for smart phones and tablets, memories have evolved at very high speed with their increasing types. As the result of such evolution, there have been introduced Wide I/O 2 (hereinafter, referred to as 'WIO2'), which is a faster version of Wide I/O, and HBM (High Bandwidth Memory), which is a new memory for graphic and high performance computers.

At present, WIO2 and HBM are manufactured with different designs from each other. Specifically, WIO2 has a structure in that a memory block and a peripheral circuit block are formed on a single chip and have a very large chip size. HBM has a structure in that a memory chip with only a memory block and a logic chip with only a peripheral block are stacked.

Such separate designs of a chip for WIO2, a memory for HBM and a logic chip for HBM results in a problem whereby much time and cost are taken for their development.

SUMMARY

Various embodiments are generally directed to a semiconductor device capable of being compatible with both WIO2 and HBM.

In an embodiment of the present invention, a semiconductor device includes: a logic chip and a memory chip stacked over the logic chip, the logic chip having a first surface facing the memory chip and a second surface opposite to the first surface and including: first and second internal input/output circuit units for exchanging signals with the memory chip; a first external input/output circuit unit for exchanging signals with the outside through first external input/output pads formed according to an external interface standard of a first memory over the second surface; and a second external input/output circuit unit for exchanging signals with the outside through second external input/output pads formed according to an external interface standard of a second memory over the second surface, wherein the semiconductor device operates in one of a first mode in which the first internal input/output circuit unit and the first external input/output circuit unit are enabled and a second mode in which the first and second internal input/output circuit units and the second external input/output circuit unit are enabled.

The first memory is for use as Wide Input/Output (WIO) and the second memory is for use as High Bandwidth Memory (HBM). The first external input/output pads may be disposed in a central region of the second surface and the second external input/output pads may be disposed in a peripheral region of the second surface. The logic chip further includes through electrodes for electrically connecting the first and second internal input/output circuit units with the memory chip.

The semiconductor device may further include external connection terminals attached onto the first external input/output pads when the semiconductor device operates in the first mode. The semiconductor device may further include external connection terminals attached onto the second external input/output pads when the semiconductor device operates in the second mode.

At least two memory chips may be stacked and the stacked memory chips are provided with through electrodes for exchanging signals with the first and second internal input/output circuit units of the logic chip.

The memory chip may include: a mode setting unit for storing a mode signal corresponding to a memory type; a memory cell array having a plurality of memory cells; a row address decoder for adjusting number of row selecting signals simultaneously activated according to the mode signal in a process of decoding a row address to selectively activate a plurality of the row selecting signals which control the data access in a row area of the memory cell array; a column address decoder for adjusting number of column selecting signals simultaneously activated according to the mode signal in a process of decoding a column address to selectively activate a plurality of the column selecting signals which control the data access in a column area of the memory cell array; first chip pads electrically connected with the first internal input/output circuit unit of the logic chip; second chip pads electrically connected with the second internal input/output circuit unit of the logic chip; and a data input/output driver for exchanging data with the logic chip through first chip pads or through the first and second chip pads according to the mode signal in a process of amplifying data in memory cell selected by the activated row selecting signals and column selecting signals and outputting the data to the logic chip or providing data inputted from the logic chip to the memory cell.

The mode setting unit may have setting fuses which are selectively cut according to the memory type.

The mode setting unit may have a mode register set for storing therein a bit information which corresponds to the memory type.

In an embodiment of the present invention, a semiconductor device includes: a logic chip and a memory chip stacked over the logic chip, the logic chip having an inactive surface facing the memory chip and an active surface opposite to the inactive surface and including: first and second internal input/output circuit units for exchanging signals with the memory chip; a first external input/output circuit unit for exchanging signals with the outside through first external input/output pads formed over the active surface in a central region; and a second external input/output circuit unit for exchanging signals with the outside through second external input/output pads formed over the active surface in a peripheral region, wherein the semiconductor device operates in one of a first mode in which the first internal input/output circuit unit and the first external input/output circuit unit are enabled and a second mode in which the first and second internal input/output circuit units and the second external input/output circuit unit are enabled.

In an embodiment of the present invention, an electronic system includes: a controller, an interface, an input/output unit, and a memory device coupled with one another through a bus, wherein the memory device includes a semiconductor device comprising: a logic chip and a memory chip stacked over the logic chip, the logic chip having a first surface facing the memory chip and a second surface opposite to the first surface and including: first and second internal input/output circuit units for exchanging signals with the memory chip; a first external input/output circuit unit for exchanging signals with the outside through first external input/output pads formed according to an external interface standard of a first memory over the second surface; and a second external input/output circuit unit for exchanging signals with the outside through second external input/output pads formed according to an external interface standard of a second memory over the second surface, wherein the semiconductor device operates in one of a first mode in which the first internal input/output circuit unit and the first external input/output circuit unit are enabled and a second mode in which the first and second internal input/output circuit units and the second external input/output circuit unit are enabled.

In an embodiment of the present invention, a memory system comprises: a memory controller; and a memory device including a semiconductor device comprising: a logic chip and a memory chip stacked over the logic chip, the logic chip having a first surface facing the memory chip and a second surface opposite to the first surface and including: first and second internal input/output circuit units for exchanging signals with the memory chip; a first external input/output circuit unit for exchanging signals with the outside through first external input/output pads formed according to an external interface standard of a first memory over the second surface; and a second external input/output circuit unit for exchanging signals with the outside through second external input/output pads formed according to an external interface standard of a second memory over the second surface, wherein the semiconductor device operates in one of a first mode in which the first internal input/output circuit unit and the first external input/output circuit unit are enabled and a second mode in which the first and second internal input/output circuit units and the second external input/output circuit unit are enabled.

In an embodiment of the present invention, a computing system comprises: a central processing unit; random access memory; an input device; and a memory system having a memory device including a semiconductor device comprising: a logic chip and a memory chip stacked over the logic chip, the logic chip having a first surface facing the memory chip and a second surface opposite to the first surface and including: first and second internal input/output circuit units for exchanging signals with the memory chip; a first external input/output circuit unit for exchanging signals with the outside through first external input/output pads according to an external interface standard of a first memory over the second surface; and a second external input/output circuit unit for exchanging signals with the outside through second external input/output pads formed according to an external interface standard of a second memory over the second surface, wherein the semiconductor device operates in one of a first mode in which the first internal input/output circuit unit and the first external input/output circuit unit are enabled and a second mode in which the first and second internal input/output circuit units and the second external input/output circuit unit are enabled.

DETAILED DESCRIPTION

Hereafter, various embodiments of the present invention will be described in detail with reference to the accompanying drawings.

Figure 1:
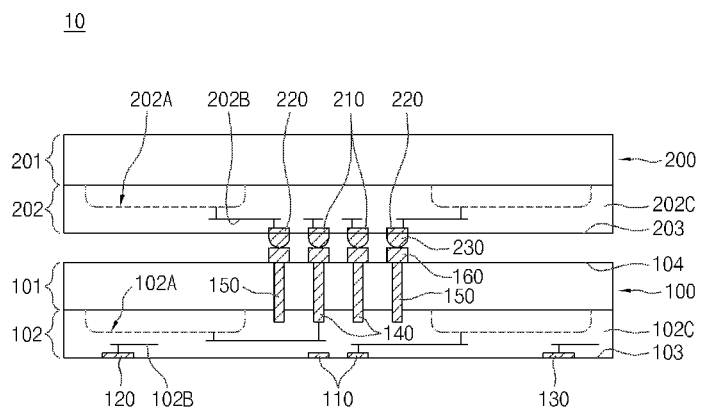
FIG. 1 is a cross-sectional view illustrating a semiconductor device in accordance with an embodiment of the present invention.

Referring to FIG. 1, the semiconductor device 10 in accordance with an embodiment of the present invention includes a logic chip 100 and a memory chip 200 stacked over the logic chip 100. Though not shown, the stacked logic chip 100 and memory chip 200 may be mounted over an external device, e.g. a package substrate.

The logic chip 100 may include a semiconductor substrate 101 and a circuit layer 102 formed over the semiconductor substrate 101. The circuit layer 102 may include an integrated circuit 102A having a plurality of elements, e.g. transistors, capacitors and resistors, wires 102B connected with the integrated circuit 102A, and an interlayer insulating film 102C that covers the wires 102B.

Figure 2:
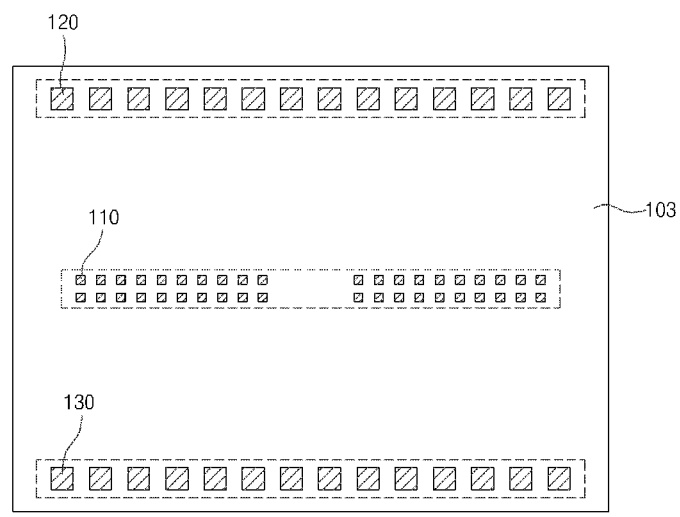
FIG. 2 is a plan view illustrating an active surface of a logic chip shown in FIG. 1.

Referring to FIGS. 1 and 2, a plurality of chip pads 110, 120 and 130 may be formed over the active surface 103 of the logic chip 100 in which the circuit layer 102 are placed. The chip pads 110, 120 and 130 may be electrically connected with the integrated circuit 102A through the wires 102B. The chip pads 110, 120 and 130 may include external input/output pads 110 and 120 for the external interface and test pads 130 for the test. The external interface means input/output of signals between the semiconductor device 10 and the external device, specifically input/output of signals between the logic chip 100 and the external device.

The semiconductor device 10 in accordance with the present invention may be operated in a first mode which corresponds to a first memory or in a second mode which corresponds to a second memory. In the present embodiment, the first memory may be a memory for WIO2 and the second memory may be a memory for HBM.

The external input/output pads 110 and 120 include first input/output pads 110 for the external interface in the first mode which corresponds to the first memory and second input/output pads 120 for the external interface in the second mode which corresponds to the second memory.

According to JEDEC (Joint Electron Device Engineering Council) standard, the external interface of WIO2 is placed in a central region of a chip and the external interface of HBM is placed in a peripheral region of a chip.

In order to comply with such external interface standards for WIO2 and HBM, the first external input/output pads 110 may be disposed in a central region of the active surface 103 of the logic chip 100, and the second external input/output pads 120 may be a peripheral region of the active surface 103 of the logic chip 100. The test pads 130 may be disposed in the other peripheral region of the active surface 103 of the logic chip 100 which is opposite to the one peripheral region for disposing the second external input/output pads 120 therein.

Figure 3:
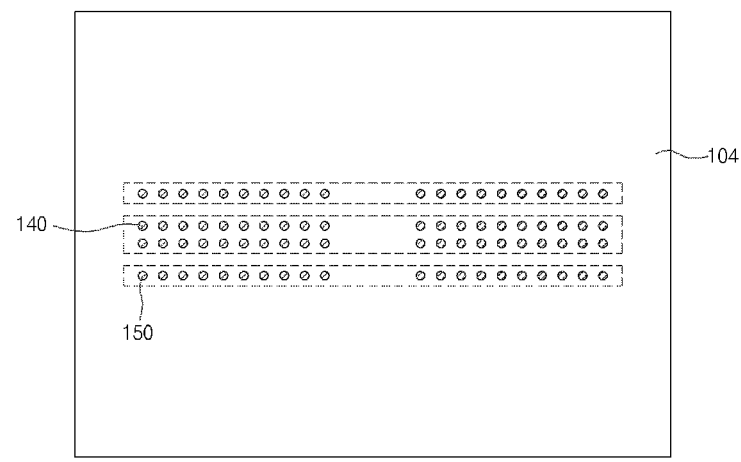
FIG. 3 is a plan view illustrating an inactive surface of a logic chip shown in FIG. 1.

Referring to FIGS. 1 and 3, the logic chip 100 may include a plurality of through electrodes 140 and 150 for the internal interface. The internal interface means input/output of signals between the internal chips of the semiconductor device 10, specifically input/output of signals between the logic chip 100 and the memory chip 200.

The through electrodes 140 and 150 pass through the central region of the semiconductor substrate 101. One ends of the through electrodes 140 and 150 are electrically connected with the integrated circuit 102A through the wires 102B and the other ends thereof opposing to the one ends are exposed on the inactive surface 104 of the logic chip 100. For the realization of Wide I/O bus, the through electrodes 140 and 150 are preferably formed in fine pitches of, for example, less than 100 μm.

The through electrodes 140 and 150 include first through electrodes 140 for the internal interface in the first and second modes and second through electrodes 150 for the internal interface in the second mode. That is to say, in the first mode corresponding to WIO2, the first through electrodes 140 are used for the internal interface, whereas in the second mode corresponding to HBM, not only the first through electrodes 140 but also the second through electrodes 150 are used for the internal interface.

Referring again to FIG. 1, the logic chip 100 may further include micro bumps 160 formed over the through electrodes 140 and 150 that are exposed on the inactive surface 104. The micro bumps 160 may include Ni, Au, Cu or an alloy thereof.

The memory chip 200 may include a semiconductor substrate 201 and a circuit layer 202 formed over the semiconductor substrate 201. The circuit layer 202 may include an integrated circuit 202A, wires 202B connected with the integrated circuit 202A and an interlayer insulating film 202C that covers the wires 202B. Chip pads 201 and 220 are formed over an active surface 203 of the memory chip 200 in which the circuit layer 202 is placed. Furthermore, micro bumps 230 may be formed over the chip pads 210 and 220. The micro bumps may be formed in a semispherical shape and may include Ni, Au, Cu or an alloy thereof.

The memory chip 200 may be stacked over the logic chip 100 such that the micro bumps 230 thereof are connected with the micro bumps 160 of the logic chip 100. Therefore, the chip pads 210 and 220 are electrically connected with the through electrodes 140 and 150 of the logic chip 100 through the micro bumps 230 and 160. The chip pads 210 and 220 may be divided into first chip pads 210 that are connected with the first through electrodes 140 of the logic chip 100 and second chip pads 220 that are connected with the second through electrodes 150 of the logic chip 100.

In the present embodiment, the through electrodes 140 and 150 of the logic chip 100, the chip pads 210 and 220 of the memory chip 200, the micro bumps 160 of the logic chip 100 and the micro bumps 230 of the memory chip 200 are explained as being formed in the central region of the respective chips. This is for allowing the logic chip 100 and the memory chip 200 to be electrically connected with each other regardless of the chip size. That is to say, the through electrodes 140 and 150, the chip pads 210 and 220, and the micro bumps 160 and 230 are disposed in the central region of the chip in consideration of physical contactability between the chips when the stacked chips have different chip sizes.

Figure 4:
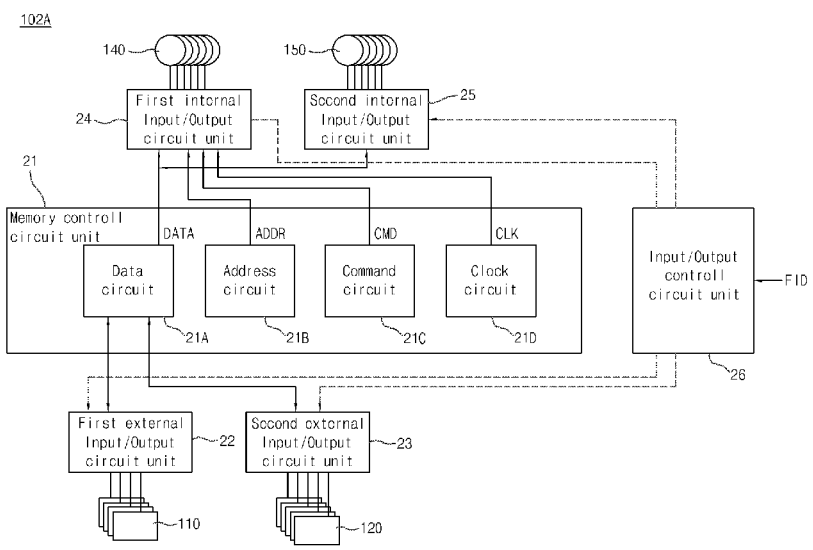
FIG. 4 is a block diagram illustrating an integrated circuit of a logic chip shown in FIG. 1.

Referring to FIG. 4, the integrated circuit 102A of the logic chip 100 as seen in FIG. 1 may include a plurality of functional circuits 21, 22, 23, 24, 25 and 26. For example, the functional circuits 21, 22, 23, 24, 25 and 26 may include a memory control circuit unit 21, first and second external input/output circuit units 22 and 23, first and second internal input/output circuit units 24 and 25 and input/output control circuit unit 26.

The memory control circuit unit 21 may provide data signal DATA and memory control signals required for the operation of the memory chip 200 (See FIG. 1). The memory control signals may include an address signal ADDR, a command signal CMD and a clock signal CLK. The memory control circuit 21 may include a data circuit 21A, an address circuit 21B, a command circuit 21C and a clock circuit 21D.

The first external input/output circuit unit 22 is electrically connected with the first external input/output pads 110. The first external input/output circuit unit 22 may receive the data signal DATA inputted from the external device through the first external input/output pads 110 to provide it to the memory control circuit unit 21, or may receive the data signal DATA inputted from the memory control circuit unit 21 to output it to the external device through the first external input/output pads 110.

The second external input/output circuit unit 23 is electrically connected with the second external input/output pads 120. The second external input/output circuit unit 23 may receive the data signal DATA inputted from the external device through the second external input/output pads 120 to provide it to the memory control circuit unit 21, or may receive the data signal DATA from the memory control circuit unit 21 to output it to the external device through the second external input/output pads 120.

The first external input/output circuit unit 22 may be enabled in the first mode corresponding to the first memory, i.e. WIO2, and the second external input/output circuit unit 23 may be enabled in the second mode corresponding to the second memory, i.e. HBM.

The first internal input/output circuit unit 24 is electrically connected with the first through electrodes 140. The first internal input/output circuit unit 24 may receive the data signal DATA from memory chip 200 (see FIG. 1) through the first through electrodes 140 to provide it to the memory control circuit unit 21, or may receive the data signal DATA and the memory control signals ADDR, CMD and CLK from the memory control circuit unit 21 to output them to the memory chip 200 through the first through electrodes 140.

The second internal input/output circuit unit 25 is electrically connected with the second through electrodes 150. The second internal input/output circuit unit 25 may receive the data signal DATA from memory chip 200 through the second through electrodes 150 to provide it to the memory control circuit unit 21, or may receive the data signal DATA from the memory control circuit unit 21 to output it to the memory chip 200 through the second through electrodes 150. The second internal input/output circuit unit 25 may be disabled in the first mode and enabled in the second mode. Therefore, in the second mode corresponding to HBM, the data signal can be inputted/outputted in a band wider than the first mode corresponding to the WIO2.

The input/output control circuit unit 26 selectively enables the first and second external input/output circuit units 22 and 23 and the first and second internal input/output circuit units 24 and 25 in response to a mode signal FID set according to memory type. The mode signal FID may be provided from the memory chip 200. The mode signal FID provided from the memory chip 200 may be transferred to the input/output control circuit unit 26 through one or more of the first through electrodes 140.

Figure 5:
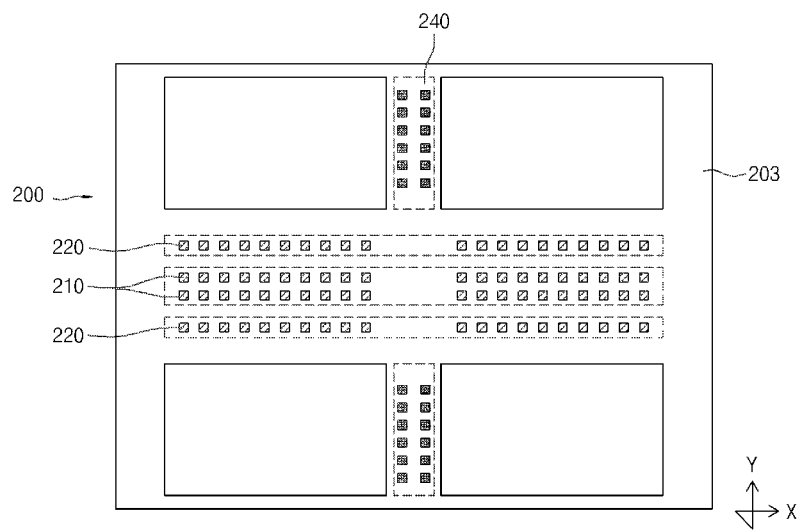
FIG. 5 is a plan view illustrating an active surface of a memory chip shown in FIG. 1.

Referring to FIG. 5, the memory chip 200 may be divided into four symmetric partitions by the chip pads 210 and 220 arranged in the middle of the active surface 203 in an x-axis direction and test pads 240 arranged in the middle of the active surface 203 in a y-axis direction.

Figure 6:
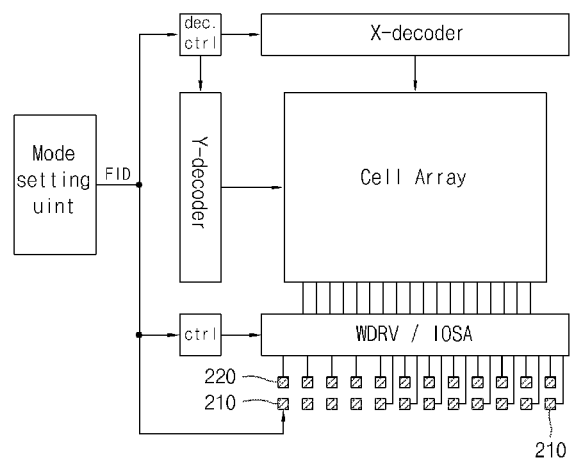
FIG. 6 is a block diagram illustrating an integrated circuit disposed in respective four partitions shown in FIG. 5.

Referring to FIG. 6, the integrated circuit included in each partition of the memory chip 200 (see FIG. 5) may include a mode setting unit, a memory cell array and various circuit blocks for driving the memory cell array.

The mode setting unit may store the mode signal FID corresponding to the memory type. The mode setting unit may consist of Mode Resist Set (MRS) that stores bit information. In this case, the mode signal FID corresponding to the memory to be used may be set by changing the MRS according to the memory type. Alternatively, the mode setting unit may consist of a plurality of setting fuses that are selectively cut. In this case, the mode signal FID corresponding to the memory to be used may be set by changing the cutting combination of the setting fuses according to the memory type.

The memory cell array consists of a plurality of memory cells. The memory cells are two-dimensionally arranged and thus can be selected in row and column areas respectively.

A row address decoder (X-decoder) decodes a row address signal inputted from the outside and selectively activates a plurality of row selecting signals that control the data access in a row area of the memory cell array. A column address decoder (Y-decoder) decodes a column address signal inputted from the outside and selectively activates a plurality of column selecting signals that control the data access in the column area of the memory cell array. Additionally, the row address decoder and column address decoder adjust the numbers of the row selecting signal and column selecting signal that are simultaneously activated according to the mode signal FID from the mode setting unit.

A decoder control unit (dec. ctrl) controls the row address decoder and column address decoder such that the numbers of the column selecting signal and row selecting signal activated according to the mode signal FID from the mode setting unit van be adjusted.

A data input/output driver WDRV/IOSA amplifies data in the memory cell selected by the row selecting signal and column selecting signal and outputs the amplified data to the logic chip 100 (see FIG. 1) through the chip pads 210 and 220, or provides input data inputted from the logic chip 100 through the chip pads 210 and 220 to the memory cell. At this time, the data input/output driver WDRV/IOSA controls the chip pads 210 and 220 such that according to the mode signal FID from the mode setting unit, only the first chip pads 210 are used for data input/output or both the first and second chip pads 210 and 220 are used for data input/output.

An input/output control unit Ctrl controls the data input/output driver WDRV/IOSA such that the data input/output driver WDRV/IOSA uses the first chip pads 210 or the first and second chip pads 210 and 220 according to the mode signal FID.

Figure 7:
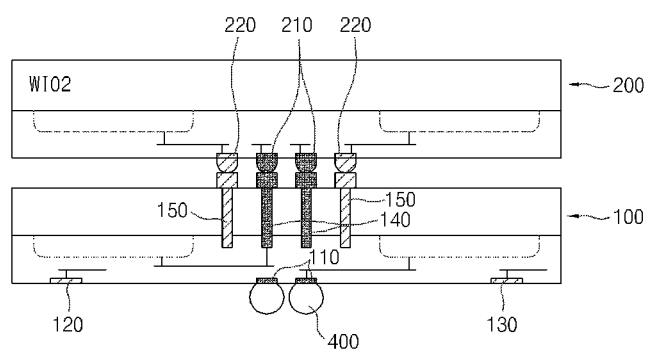
FIG. 7 is a view illustrating a case where the semiconductor device in accordance with the present invention is used as a WIO2.

FIG. 7 is a view illustrating a case where the semiconductor device in accordance with the present invention is used as a WIO2 semiconductor device.

As shown, the WIO2 memory chip 200 is stacked over the logic chip 100, and external connection terminals 400 are attached onto the first external input/output pads 110 formed according to the external interface standard of WIO2. The external connection terminals 400 may include solder balls or micro bumps. Before the external connection terminals 400 are attached after the WIO2 memory chip 200 is stacked over the logic chip 100, probe tests for the memory chip 200 through the test pads 130 may be performed. The stacked logic chip 100 and memory chip 200 are mounted over an external device (not shown), e.g. a package substrate via the external connection terminals 400.

Referring to FIGS. 4 and 7, the input/output control circuit unit 26 of the logic chip 100 enables the first external input/output circuit unit 22 and the first internal input/output circuit unit 24 in response to the mode signal FID inputted from the memory chip 200. At this time, the second external input/output circuit unit 23 and the second internal input/output circuit unit 25 are maintained as disabled.

Accordingly, data signals are exchanged between the external device and logic chip 100 through the first external input/output pads 110, and transfer of data signals and memory control signals from the logic chip 100 to the memory chip 200 and transfer of data signals from the memory chip 200 to the logic chip 100 are performed through the first through electrodes 140 of the logic chip 100 and the first chip pads 210 of the memory chip 200. The dark portions in FIG. 7 represent elements that are used for the signal transfer when the semiconductor device is used as WIO2. Additionally, the same reference numbers in FIG. 1 are used throughout FIG. 7 to refer to the same or like parts.

Figure 8:
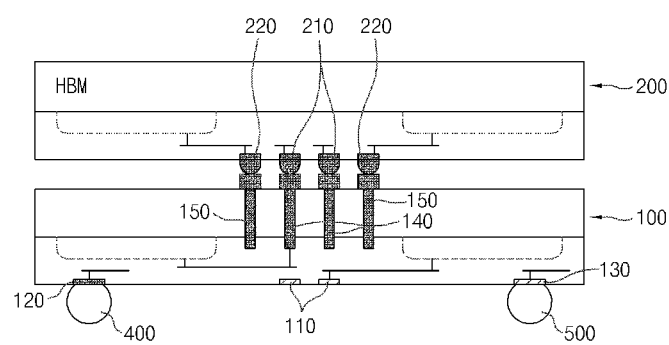
FIG. 8 is a view illustrating a case where the semiconductor device in accordance with the present invention is used as a HBM.

FIG. 8 is a view illustrating a case where the semiconductor device in accordance with the present invention is used as a HBM semiconductor device.

As shown, the HBM memory chip 200 is stacked over the logic chip 100 and external connection terminals 400 are attached onto the second external input/output pads 120 formed according to the external interface standard of HBM. The external connection terminals 400 may include solder balls or micro bumps. Before the external connection terminals 400 are attached after the HBM memory chip 200 is stacked over the logic chip 100, probe test for the memory chip 200 through the test pads 130 may be performed.

The stacked logic chip 100 and memory chip 200 are mounted over an external device (not shown), e.g. a package substrate via the external connection terminals 400. At this time, the semiconductor device 10 may be tilted as the external connection terminals 400 are formed at only one periphery of the logic chip 100. In order to prevent such tilt, dummy patterns 500 may be further formed over the test pads 130. The dummy patterns 500 may be formed of the same shape and material as the external connection terminals 400. For example, the dummy patterns 500 may be formed of solder balls or micro bumps. Alternatively, the dummy patterns 500 may be formed of an insulating material such as insulation balls or insulation bumps since they are formed for the purpose of preventing tilt of the semiconductor device 10 and are not electrically connected with the external device.

Referring to FIGS. 4 and 8, the input/output control circuit unit 26 of the logic chip 100 enables the second external input/output circuit unit 23 and the first and second internal input/output circuit units 24 and 25 in response to the mode signal FID inputted from the memory chip 200. At this time, the first external input/output circuit unit 22 is maintained as disabled.

Accordingly, data signals are exchanged between the external device and logic chip 100 through the second external input/output pads 120, and the transfer of data signals and memory control signals from the logic chip 100 to the memory chip 200 and the transfer of data signals from the memory chip 200 to the logic chip 100 are performed through the first and second through electrodes 140 and 150 of the logic chip 100 and the first and second chip pads 210 and 220 of the memory chip 200. The dark portions in FIG. 8 represent elements that are used for the signal transfer when the semiconductor device is used as HBM.

Figure 9:
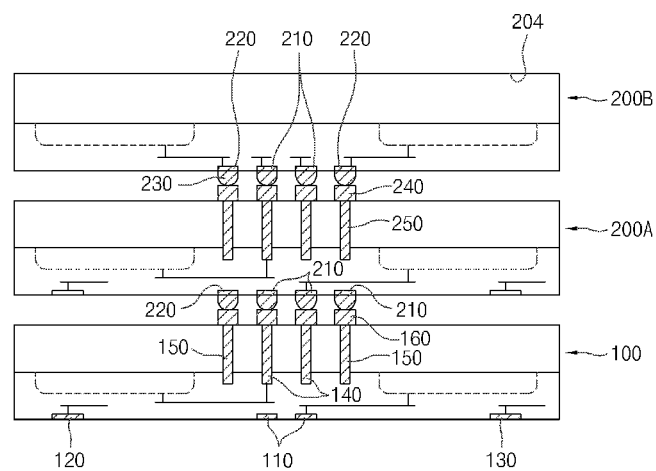
FIG. 9 is a cross-sectional view illustrating a semiconductor device in accordance with an embodiment of the present invention.

In the above described embodiment, a single memory chip 200 is stacked over the logic chip 100. However, the present invention is not limited thereto, and two or more memory chips may be stacked over the logic chip. An example of such semiconductor device is shown in FIG. 9.

As shown, two memory chips 200A and 200B are stacked over the logic chip 100. In order to allow signals to be commonly transferred to the stacked memory chips 200A and 200B, the memory chip 200A positioned below is formed with through electrodes 250. The present embodiments are the same as the embodiments described with reference to FIGS. 1 to 6 except for the numbers of the stacked memory chips and the through electrodes 250. Therefore, duplicated description for the same parts will be omitted.

The semiconductor device in accordance with various embodiments may be applied to a variety of electronic apparatuses.

Figure 10:
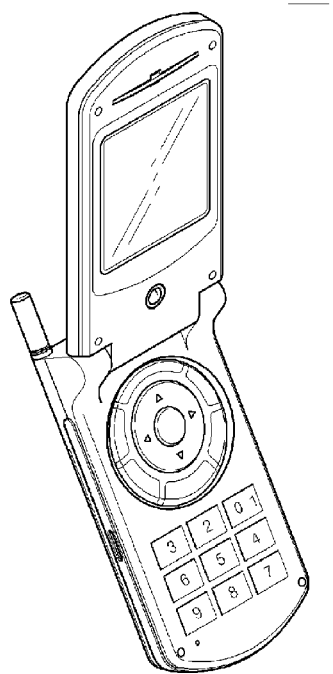
FIG. 10 is a perspective view illustrating an electronic apparatus having the semiconductor device in accordance with various embodiments of the present invention.

Referring to FIG. 10, the semiconductor device in accordance with various embodiments may be applied to an electronic apparatus 1000 such as a mobile phone. The semiconductor device in accordance with various embodiments is advantageous in improving performance and cost competitiveness of the electronic apparatus 1000 since time and cost for development of semiconductor device can be reduced due to its compatibility with two types of memory. The electronic apparatus 1000 is not limited to the mobile phone shown in FIG. 10, and may include various electronic appliances, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

The semiconductor device in accordance with various embodiments may be applied to an electronic system.

Figure 11:
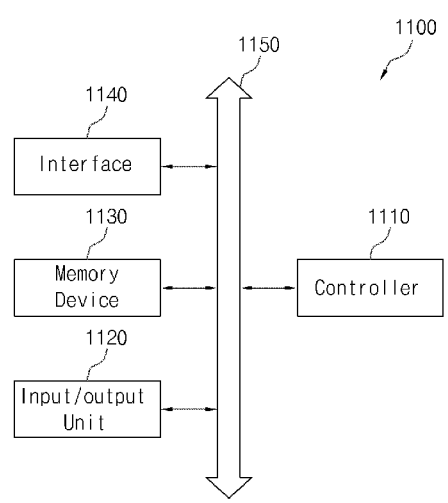
FIG. 11 is a block diagram illustrating an electronic system having the semiconductor device in accordance with various embodiments of the present invention.

Referring to FIG. 11, an electronic system 1100 including the semiconductor device in accordance with various embodiments may include a controller 1110, an input/output unit 1120, and a memory device 1130. The controller 1110, the input/output unit 1120 and the memory device 1130 may be coupled with one another through a bus 1150. The bus 1150 serves as a path through which data move.

For example, the controller 1110 may include at least any one of the following: one or more microprocessors, one or more digital signal processors, one or more microcontrollers, and logic devices capable of performing the same functions as these components.

The input/output unit 1120 may include at least one selected among a keypad, a keyboard, a display device, and so forth.

The memory device 1130 is a device for storing data. The memory device 1130 may store data and/or commands to be executed by the controller 1110 and the like. The memory device 1130 may include the semiconductor device according to various embodiments of the present invention. The memory device 1130 may include a volatile memory device and/or a nonvolatile memory device. The memory device 1130 may include a flash memory. For example, a flash memory to which the technology of the present invention may be mounted to an information processing system such as a mobile terminal or a desktop computer. The flash memory may be constituted by a solid state drive (SSD). In this case, the electronic system 1100 may stably store a large amount of data in a flash memory system.

The electronic system 1100 may further include an interface 1140 configured to transmit and receive data to and from a communication network. The interface 1140 may be a wired or wireless type. For example, the interface 1140 may include an antenna or a wired (or wireless) transceiver.

Furthermore, though not shown, a person skilled in the art will readily appreciate that the electronic system 1100 may additionally include an application chipset, a camera image processor (CIP), an input/output unit, etc.

The semiconductor device in accordance with various embodiments may be applied to a memory system.

Figure 12:
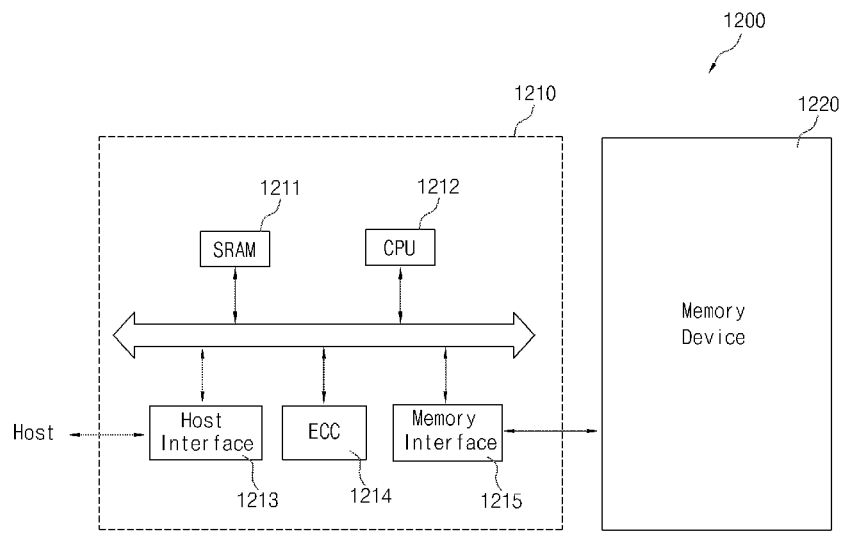
FIG. 12 is a block diagram illustrating a memory system having the semiconductor device in accordance with various embodiments of the present invention.

Referring to FIG. 12, the memory system 1200 including the semiconductor device in accordance with various embodiments may include a memory device 1220 and a controller 1210.

The memory device 1220 may serve as a volatile device such as a dynamic random-access memory (DRAM) or a nonvolatile memory device such as a magnetoresistive RAM (MRAM), spin torque transfer MRAM (STT-MRAM), phase-change RAM (PCRAM), resistive RAM (ReRAM), or ferroelectric RAM (FeRAM). The memory device 1220 may include the semiconductor package according to various embodiments of the present invention.

The controller 1210 may control the memory device 1220, and may include a static random-access memory (SRAM) 1211, a central processing unit (CPU) 1212, a host interface 1213, an error correction code block (ECC) 1214 and a memory interface 1215. The SRAM 1211 is used as an operation memory of the CPU 1212, the CPU 1212 performs control operation for data exchange of the controller 1210, and the host interface 1213 has data exchange protocol of a host accessed to the memory system 1200. The ECC 1214 detects and corrects error of data read from the memory device 1220, and the memory interface 1215 interfaces with the semiconductor memory device 1220. The controller 1210 may further include read-only memory (ROM) for storing data for interfacing with the host, etc.

The memory system 1200 may be used as a memory card or a solid state disk SSD by combination of the memory device 1220 and the controller 1210. In the event that the memory system 1200 is the SSD, the controller 1210 communicates with an external device, e.g. host through one of various interface protocols such as USB, MMC, PCI-E, SATA, PATA, SCSI, ESDI, IDE, etc.

The semiconductor device in accordance with various embodiments may be applied to a computing system.

Figure 13:
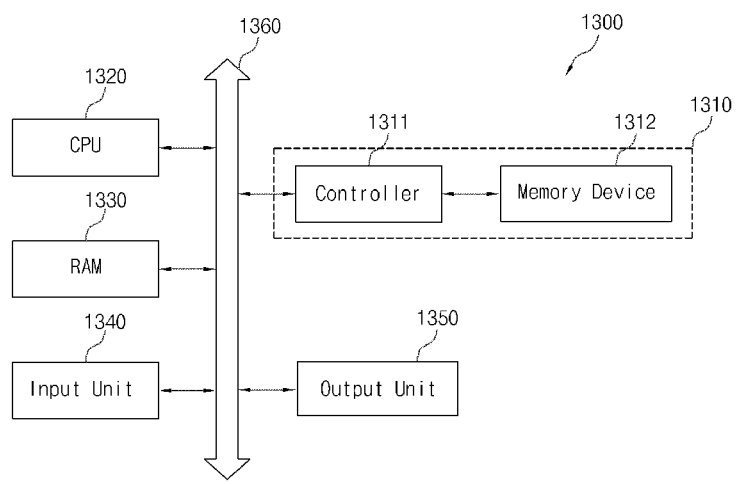
FIG. 13 is a block diagram illustrating a computing system having the semiconductor device in accordance with various embodiments of the present invention.

Referring to FIG. 13, the computing system 1300 including the semiconductor device in accordance with various embodiments may include a CPU 1320, a RAM 1330, an input unit 1340, an output unit 1350, and a memory system 1310 having a controller 1311 and a memory device 1312, connected electrically to a system bus 1360. In case that the computing system 1300 is a mobile device, a battery (not shown) for supplying an operation voltage to the computing system 1300 may be further provided. The computing system 1300 of the present invention may further include an application chipset, a CMOS image processor CIS, a mobile DRAM, etc.

The output device or input device 1340 may be a self-contained display in the case of a portable electronic device. The input device or output device 1350 may be a physical keyboard or a virtual keyboard in the case of a portable electronic device such as i.e. a smartphone, tablet pc, laptop, etc. The portable electronic device may further include, without limitation, a trackball, touchpad, or other cursor control device combined with a selection control, such as a pushbutton, to select an item highlighted by cursor manipulation. The memory system 1310 may include a memory device which comprises the semiconductor package according to various embodiments of the present invention as described in FIG. 12.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising: a logic chip and a memory chip stacked over the logic chip, the logic chip having a first surface facing the memory chip and a second surface opposite to the first surface and including:
    first and second internal input/output circuit units for exchanging signals with the memory chip;
    a first external input/output circuit unit for exchanging signals with the outside through first external input/output pads formed according to an external interface standard of a first memory over the second surface; and
    a second external input/output circuit unit for exchanging signals with the outside through second external input/output pads formed according to an external interface standard of a second memory over the second surface,
    wherein the semiconductor device operates in one of a first mode in which the first internal input/output circuit unit and the first external input/output circuit unit are enabled and a second mode in which the first and second internal input/output circuit units and the second external input/output circuit unit are enabled.

2. The semiconductor device of claim 1, wherein the first memory is for use as Wide Input/Output (WIO) and the second memory is for use as High Bandwidth Memory (HBM).

3. The semiconductor device of claim 1, wherein the first external input/output pads are disposed in a central region of the second surface and the second external input/output pads are disposed in a peripheral region of the second surface.

4. The semiconductor device of claim 1, wherein the logic chip further includes through electrodes for electrically connecting the first and second internal input/output circuit units with the memory chip.

5. The semiconductor device of claim 4, wherein the through electrodes are formed in fine pitches of less than 100 μm.

6. The semiconductor device of claim 4, wherein the logic chip includes a semiconductor substrate of which the through electrodes are positioned to pass through a central region of the semiconductor substrate.

7. The semiconductor device of claim 1, further comprising external connection terminals attached onto the first external input/output pads when the semiconductor device operates in the first mode.

8. The semiconductor device of claim 1, further comprising external connection terminals attached onto the second external input/output pads when the semiconductor device operates in the second mode.

9. The semiconductor device of claim 1, wherein at least two memory chips are stacked and the stacked memory chips are provided with through electrodes for exchanging signals with the first and second internal input/output circuit units of the logic chip.

10. The semiconductor device of claim 9, wherein at least two memory chips have different chip sizes and have through electrodes disposed in a central region of the chips.

11. The semiconductor device of claim 1, wherein the memory chip includes:
    a mode setting unit for storing a mode signal corresponding to a memory type;
    a memory cell array having a plurality of memory cells;
    a row address decoder for adjusting a number of row selecting signals simultaneously activated according to the mode signal in a process of decoding a row address to selectively activate a plurality of the row selecting signals which control the data access in a row area of the memory cell array;
    a column address decoder for adjusting a number of column selecting signals simultaneously activated according to the mode signal in a process of decoding a column address to selectively activate a plurality of the column selecting signals which control the data access in a column area of the memory cell array;
    first chip pads electrically connected with the first internal input/output circuit unit of the logic chip;
    second chip pads electrically connected with the second internal input/output circuit unit of the logic chip; and
    a data input/output driver for exchanging data with the logic chip through first chip pads or through the first and second chip pads according to the mode signal in a process of amplifying data in memory cell selected by the activated row selecting signals and column selecting signals and outputting the data to the logic chip or providing data inputted from the logic chip to the memory cell.

12. The semiconductor device of claim 11, wherein the mode setting unit has setting fuses which are selectively cut according to the memory type.

13. The semiconductor device of claim 11, wherein the mode setting unit has a mode register set for storing therein a bit information which corresponds to the memory type.

14. The semiconductor device of claim 11, wherein only the first chip pads are used for data input/output when the memory type is Wide Input/Output (WIO) and both the first and second chip pads are used for data input/output when the memory type is used as a High Bandwidth Memory (HBM).

15. A semiconductor device, comprising: a logic chip and a memory chip stacked over the logic chip, the logic chip having an inactive surface facing the memory chip and an active surface opposite to the inactive surface and including:
    first and second internal input/output circuit units for exchanging signals with the memory chip;
    a first external input/output circuit unit for exchanging signals through first external input/output pads formed over the active surface in a central region; and
    a second external input/output circuit unit for exchanging signals through second external input/output pads formed over the active surface in a peripheral region,
    wherein the semiconductor device operates in one of a first mode in which the first internal input/output circuit unit and the first external input/output circuit unit are enabled and a second mode in which the first and second internal input/output circuit units and the second external input/output circuit unit are enabled.

16. An electronic system including a controller, an interface, an input/output unit, and a memory device coupled with one another through a bus, wherein the memory device includes a semiconductor device comprising: a logic chip and a memory chip stacked over the logic chip, the logic chip having a first surface facing the memory chip and a second surface opposite to the first surface and including:

first and second internal input/output circuit units for exchanging signals with the memory chip;

a first external input/output circuit unit for exchanging signals with the outside through first external input/output pads formed according to an external interface standard of a first memory over the second surface; and a second external input/output circuit unit for exchanging signals with the outside through second external input/output pads formed according to an external interface standard of a second memory over the second surface, wherein the semiconductor device operates in one of a first mode in which the first internal input/output circuit unit and the first external input/output circuit unit are enabled and a second mode in which the first and second internal input/output circuit units and the second external input/output circuit unit are enabled.

\* \* \* \* \*